United States Patent
Kool et al.

(10) Patent No.: US 12,116,678 B2
(45) Date of Patent: Oct. 15, 2024

(54) SURFACES FOR CONTACTING A HYDROCARBON FLUID AND METHODS FOR PREPARING THE SAME

(71) Applicant: General Electric Company, Schenectady, NY (US)

(72) Inventors: Lawrence B. Kool, Clifton Park, NY (US); Alfred Albert Mancini, Cincinnati, OH (US); Bangalore Aswatha Nagaraj, West Chester, OH (US)

(73) Assignee: GENERAL ELECTRIC COMPANY, Evendale, OH (US)

( * ) Notice: Subject to any disclaimer, the term of this patent is extended or adjusted under 35 U.S.C. 154(b) by 0 days.

(21) Appl. No.: 18/320,437

(22) Filed: May 19, 2023

(65) Prior Publication Data

US 2023/0287575 A1    Sep. 14, 2023

Related U.S. Application Data

(63) Continuation of application No. 17/338,066, filed on Jun. 3, 2021, now Pat. No. 11,686,003.

(51) Int. Cl.
| | |
|---|---|
| *C23F 11/167* | (2006.01) |
| *C23C 16/02* | (2006.01) |
| *C23C 16/06* | (2006.01) |
| *C23C 16/56* | (2006.01) |
| *F16L 58/04* | (2006.01) |
| *F02C 7/00* | (2006.01) |

(52) U.S. Cl.
CPC ........ *C23F 11/167* (2013.01); *C23C 16/0272* (2013.01); *C23C 16/06* (2013.01); *C23C 16/56* (2013.01); *F02C 7/00* (2013.01); *F16L 58/04* (2013.01)

(58) Field of Classification Search
None
See application file for complete search history.

(56) References Cited

U.S. PATENT DOCUMENTS

| | | |
|---|---|---|
| 5,805,973 A | 9/1998 | Coffinberry et al. |
| 6,156,439 A | 12/2000 | Coffinberry |
| | (Continued) | |

OTHER PUBLICATIONS

Marjorie E. Squires et al., C—H Activation by [Bis(dialkoxyphosphino)ethane]platinum(0) and [Bis(diaminophosphino)ethane]platinum(0) Complexes: Platinum-Platinum Dimer Formation Limits Yields, Organometallics vol. 13, No. 8, 1994, pp. 2970-2978. [Cited in Parent].

*Primary Examiner* — Jose I Hernandez-Kenney
(74) *Attorney, Agent, or Firm* — Venable LLP; David D. Leege; Michele V. Frank

(57) ABSTRACT

A component configured to be in contact with a hydrocarbon fluid and a method of preparing a contact surface of the component. The component may include a wall having the contact surface configured to be in contact with the hydrocarbon fluid. The contact surface is formed from a metal comprising a metal M, where M is selected from the group consisting of nickel (Ni), palladium (Pd), and platinum (Pt). A metal-ligand complex comprising phosphorus (P) is on the contact surface. The method of preparing a contact surface of the component may include treating the contact surface with a metal-ligand complex precursor comprising a phosphorus (P) ligand.

20 Claims, 6 Drawing Sheets

(56) References Cited

U.S. PATENT DOCUMENTS

| | | | |
|---|---|---|---|
| 6,682,780 B2 | 1/2004 | Tzatzov et al. | |
| 6,808,816 B2* | 10/2004 | Mancini | C23C 16/18 |
| | | | 427/255.15 |
| 7,326,469 B2* | 2/2008 | Dye | C23C 16/448 |
| | | | 416/241 B |
| 8,343,580 B2 | 1/2013 | Wang et al. | |
| 10,428,429 B2 | 10/2019 | Hong et al. | |
| 10,683,807 B2 | 6/2020 | McMasters et al. | |
| 2008/0073063 A1* | 3/2008 | Clavenna | F28F 19/02 |
| | | | 165/84 |
| 2011/0014372 A1* | 1/2011 | Webber | C07C 4/04 |
| | | | 204/192.15 |
| 2012/0118746 A1* | 5/2012 | Isogai | F16L 58/1072 |
| | | | 205/198 |
| 2014/0237800 A1* | 8/2014 | Drees | C09D 7/61 |
| | | | 29/458 |
| 2015/0083397 A1* | 3/2015 | Monroe | E21B 41/02 |
| | | | 166/244.1 |
| 2019/0077819 A1 | 3/2019 | Girolami et al. | |
| 2019/0382898 A1 | 12/2019 | Kool et al. | |

* cited by examiner

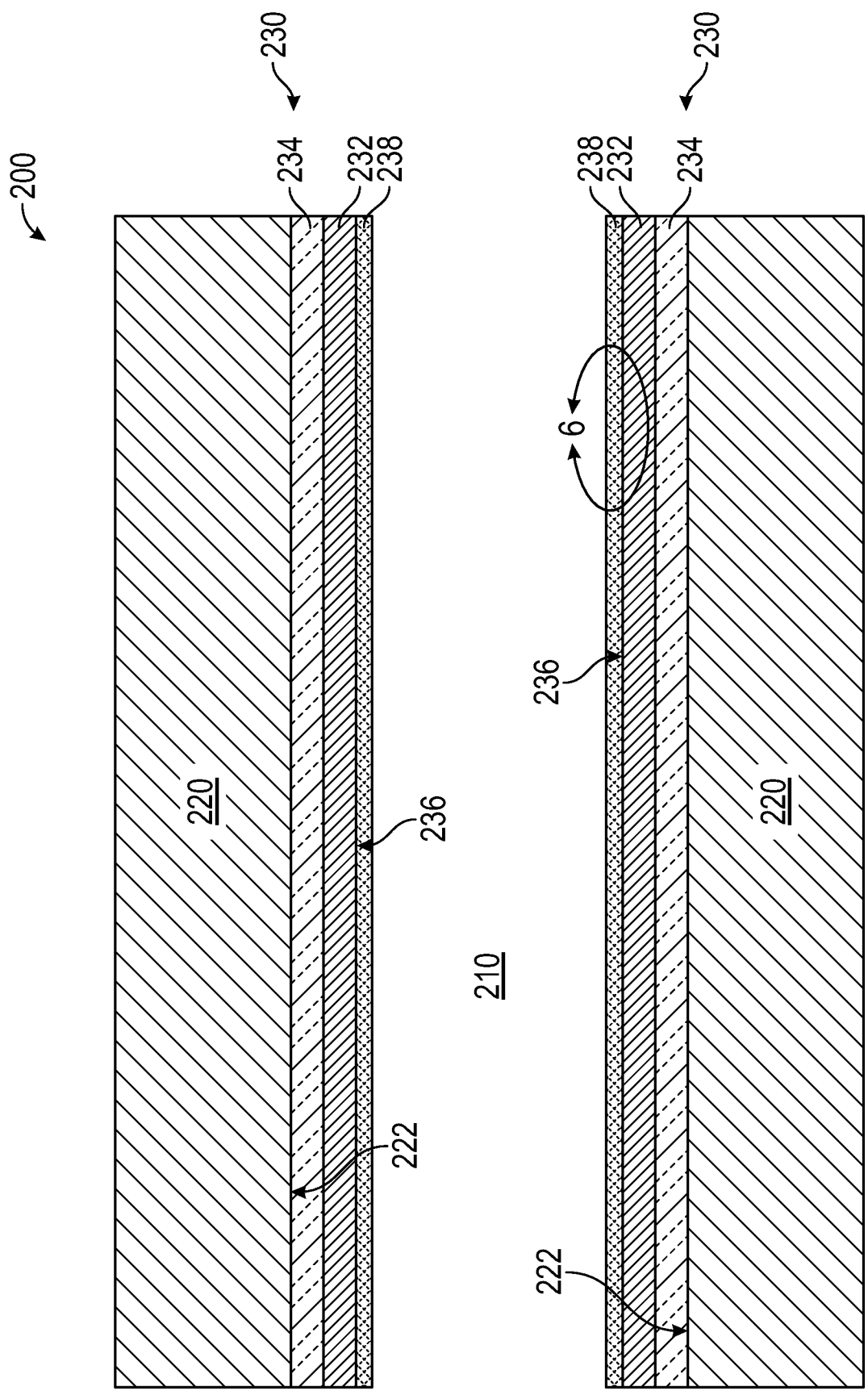

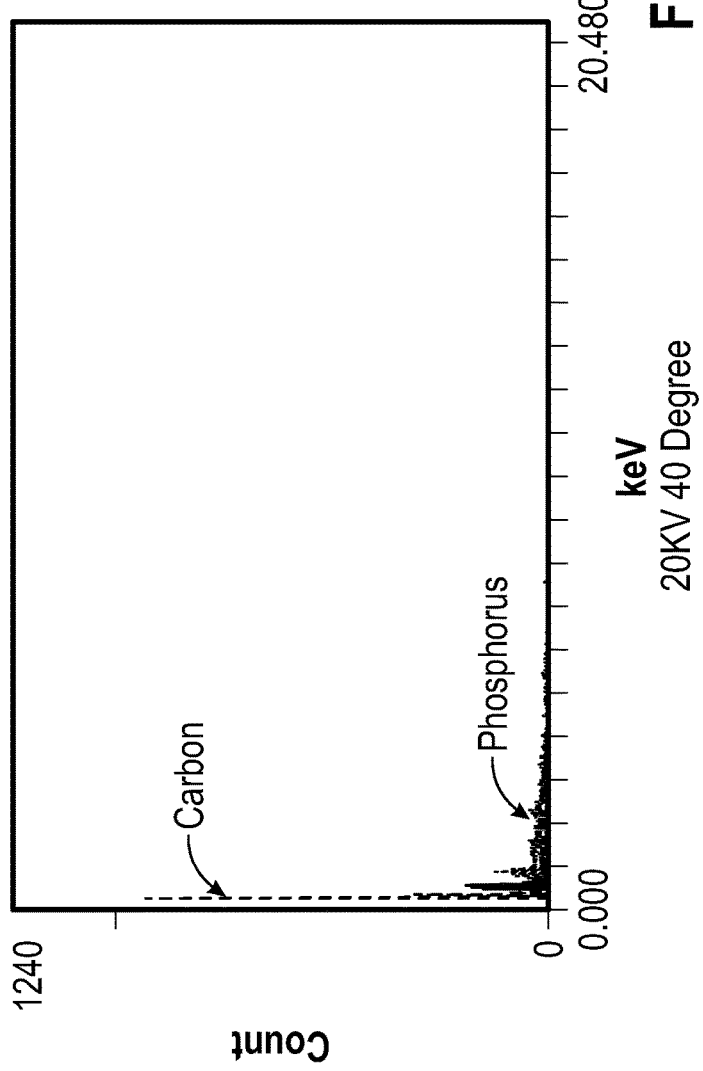

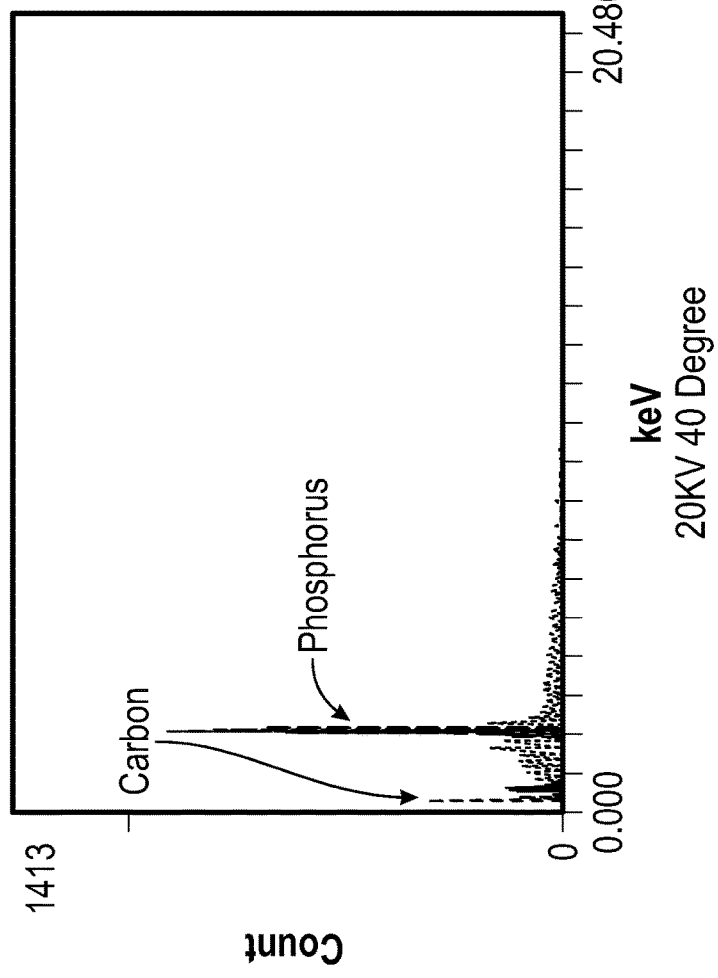

↓ Reductive elimination

↓ Bond to Pt surface

SURFACES FOR CONTACTING A HYDROCARBON FLUID AND METHODS FOR PREPARING THE SAME

CROSS-REFERENCE TO RELATED APPLICATIONS

This application is a continuation of U.S. patent application Ser. No. 17/338,066 filed on Jun. 3, 2021, the contents of which are hereby incorporated by reference in their entirety.

TECHNICAL FIELD

Preferred embodiments described herein relate to components in contact with hydrocarbon fluids, particularly components for gas turbine engines for aircraft, and methods for preparing the same.

BACKGROUND

Gas turbine engines include surfaces that contact hydrocarbon fluids, such as fuels and lubricating oils. Carbonaceous deposits (also known as coke) may form on these surfaces when exposed to the hydrocarbon fluids at elevated temperatures, resulting in carbon becoming attached and building up as deposits on surfaces contacted by a fuel or oil.

BRIEF SUMMARY

According to an embodiment, a method of preparing a contact surface of a component for contact with a hydrocarbon fluid, the method comprising: forming the contact surface from a metal, the metal comprising a metal M, wherein M is selected from the group consisting of nickel (Ni), palladium (Pd), and platinum (Pt); treating the contact surface with a metal-ligand complex precursor comprising a phosphorus (P) ligand.

Additional features, advantages, and embodiments of the present disclosure are set forth or apparent from consideration of the following detailed description, drawings and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The foregoing and other features and advantages will be apparent from the following, more particular, description of various exemplary embodiments, as illustrated in the accompanying drawings, wherein like reference numbers generally indicate identical, functionally similar, and/or structurally similar elements.

FIG. 3 is a schematic of a portion of a component of the gas turbine engine shown in FIG. 2 that is configured to be in contact with the hydrocarbon fluid.

FIGS. 4A-4F are scanning electron microscopy results for a test coupon exposed to a fuel without an additive. FIG. 4A is a SEM image. FIG. 4B is an elemental map of nitrogen (N). FIG. 4C is an elemental map of phosphorus (P). FIG. 4D is an elemental map of oxygen (O). FIG. 4E is an elemental map of carbon (C). FIG. 4F is an energy dispersive X-ray spectroscopy (EDS) spectrum.

FIGS. 5A-5F are scanning electron microscopy (SEM) results for a test coupon exposed to a fuel with a phosphorus additive. FIG. 5A is an SEM image. FIG. 5B is an elemental map of nitrogen (N). FIG. 5C is an elemental map of phosphorus (P). FIG. 5D is an elemental map of oxygen (O). FIG. 5E is an elemental map of carbon (C). FIG. 5F is an energy dispersive X-ray spectroscopy (EDS) spectrum.

FIG. 6A shows a chelating layer according to an embodiment of the present disclosure, and FIG. 6B shows another chelating layer according to an embodiment of the present disclosure.

FIG. 7A shows a metal complex used to form the chelating layer. FIG. 7B shows a reductive elimination step forming a five-membered platinacycle, and FIG. 7C shows a step of the five-membered platinacycle bonding to the component shown in FIG. 3 to form the chelating layer.

DETAILED DESCRIPTION

Various embodiments are discussed in detail below. While specific embodiments are discussed, this is done for illustration purposes only. A person skilled in the relevant art will recognize that other components and configurations may be used without departing from the spirit and scope of the present disclosure.

As noted above, coke deposition may occur on surfaces of a gas turbine engine that are exposed to hydrocarbon fluids, such as fuels and lubricating oils, at elevated temperatures. Such carbon deposits may develop if the fluid circuit is operated at reduced flow rates or closed without the remaining stagnant fuel being purged. As the deposits collect, they can become sufficiently large to reduce or even obstruct fluid flow. In the case of a fuel circuit, such carbon deposition can lead to degraded engine performance, reduced heat transfer efficiencies, increased pressure drops, and increased rates of material corrosion and erosion, all of which can necessitate the use of expensive de-coking procedures and even replacement of fuel nozzles. The present disclosure discusses ways to prevent such carbon deposits on a surface of a component that contacts hydrocarbon fluids, and particularly to such components used in a gas turbine engine for an aircraft. Preferred embodiments described herein relate to components and methods for preventing carbon deposits from hydrocarbon fluids at elevated temperatures. In particular, the embodiments relate to modifying a surface wetted by, or in contact with, the hydrocarbon fluid.

Figure 1:
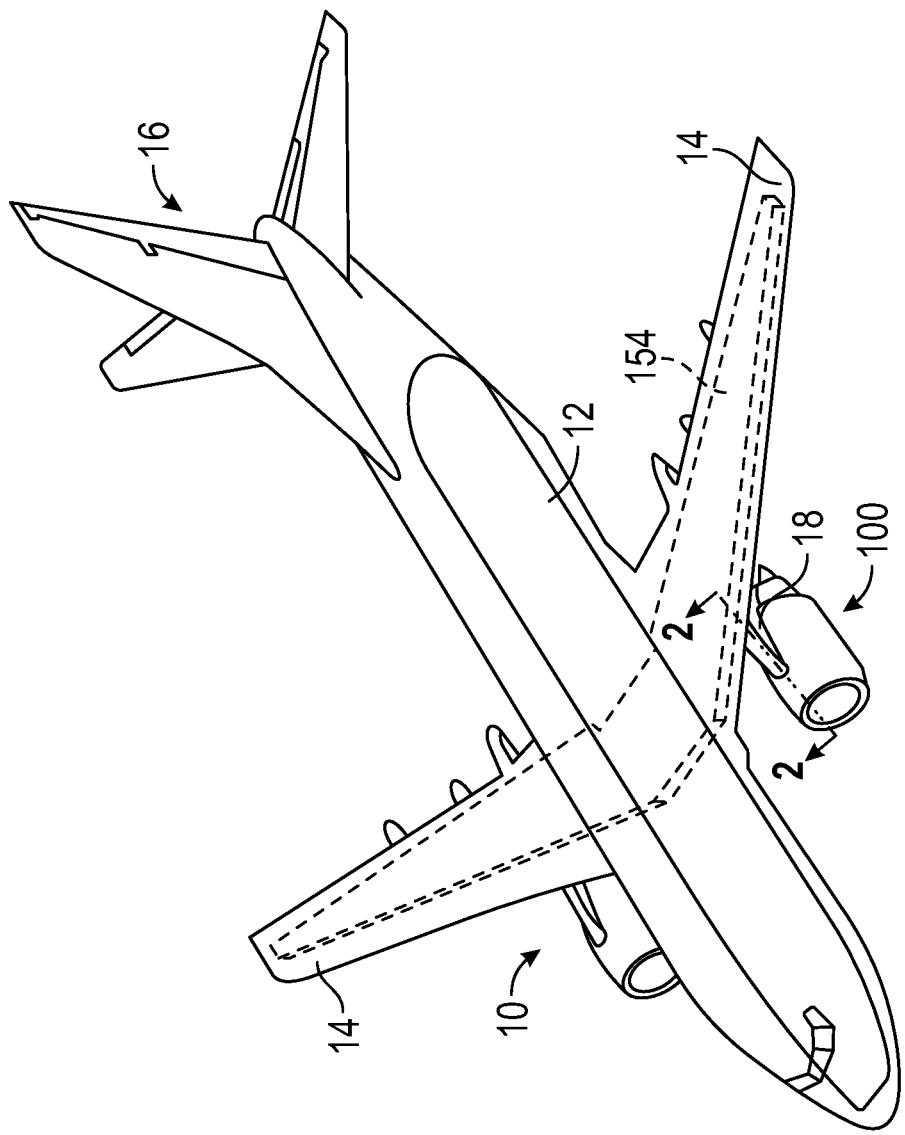
FIG. 1 is a schematic perspective view of an aircraft having a component implementing the coking preventive coating according to an embodiment of the present disclosure.

The methods and components discussed herein are particularly suitable for use in engines, such as a gas turbine engine used on an aircraft. FIG. 1 is a perspective view of an aircraft 10 that may implement various preferred embodiments. The aircraft 10 includes a fuselage 12, wings 14 attached to the fuselage 12, and an empennage 16. The aircraft 10 also includes a propulsion system that produces a propulsive thrust required to propel the aircraft 10 in flight, during taxiing operations, and the like. The propulsion system for the aircraft 10 shown in FIG. 1 includes a pair of engines 100. In this embodiment, each engine 100 is attached to one of the wings 14 by a pylon 18 in an under-wing configuration. Although the engines 100 are shown attached to the wing 14 in an under-wing configuration in FIG. 1, in other embodiments, the engine 100 may have alternative configurations and be coupled to other portions of the aircraft 10. For example, the engine 100 may additionally or alternatively include one or more aspects coupled to other parts of the aircraft 10, such as, for example, the empennage 16, and the fuselage 12.

As will be described further below with reference to FIG. 2, the engines 100 shown in FIG. 1 are gas turbine engines that are each capable of selectively generating a propulsive thrust for the aircraft 10. The amount of propulsive thrust may be controlled at least in part based on a volume of fuel provided to the gas turbine engines 100 via a fuel system 150. An aviation turbine fuel in the embodiments discussed herein is a combustible hydrocarbon liquid fuel, such as a kerosene-type fuel, having a desired carbon number. The fuel is stored in a fuel tank 154 of the fuel system 150. As shown in FIG. 1, at least a portion of the fuel tank 154 is located in each wing 14 and a portion of the fuel tank 154 is located in the fuselage 12 between the wings 14. The fuel tank 154, however, may be located at other suitable locations in the fuselage 12 or the wing 14. The fuel tank 154 may also be located entirely within the fuselage 12 or the wing 14. The fuel tank 154 may also be separate tanks instead of a single, unitary body, such as, for example, two tanks each located within a corresponding wing 14.

Although the aircraft 10 shown in FIG. 1 is an airplane, the embodiments described herein may also be applicable to other aircraft 10, including, for example, helicopters and unmanned aerial vehicles (UAV). Preferably, the aircraft discussed herein are fixed-wing aircraft or rotor aircraft that generate lift by aerodynamic forces acting on, for example, a fixed wing (e.g., wing 14) or a rotary wing (e.g., rotor of a helicopter), and are heavier-than-air aircraft, as opposed to lighter-than-air aircraft (such as a dirigible).

For the embodiment depicted, the engine 100 is a high bypass turbofan engine. The engine 100 may also be referred to as a turbofan engine 100 herein. FIG. 2 is a schematic, cross-sectional view of one of the engines 100 used in the propulsion system for the aircraft 10 shown in FIG. 1. The turbofan engine 100 has an axial direction A (extending parallel to a longitudinal centerline 101, shown for reference in FIG. 2), a radial direction R, and a circumferential direction. The circumferential direction (not depicted in FIG. 2) extends in a direction rotating about the axial direction A. The turbofan engine 100 includes a fan section 102 and a turbomachine 104 disposed downstream from the fan section 102.

Figure 2:
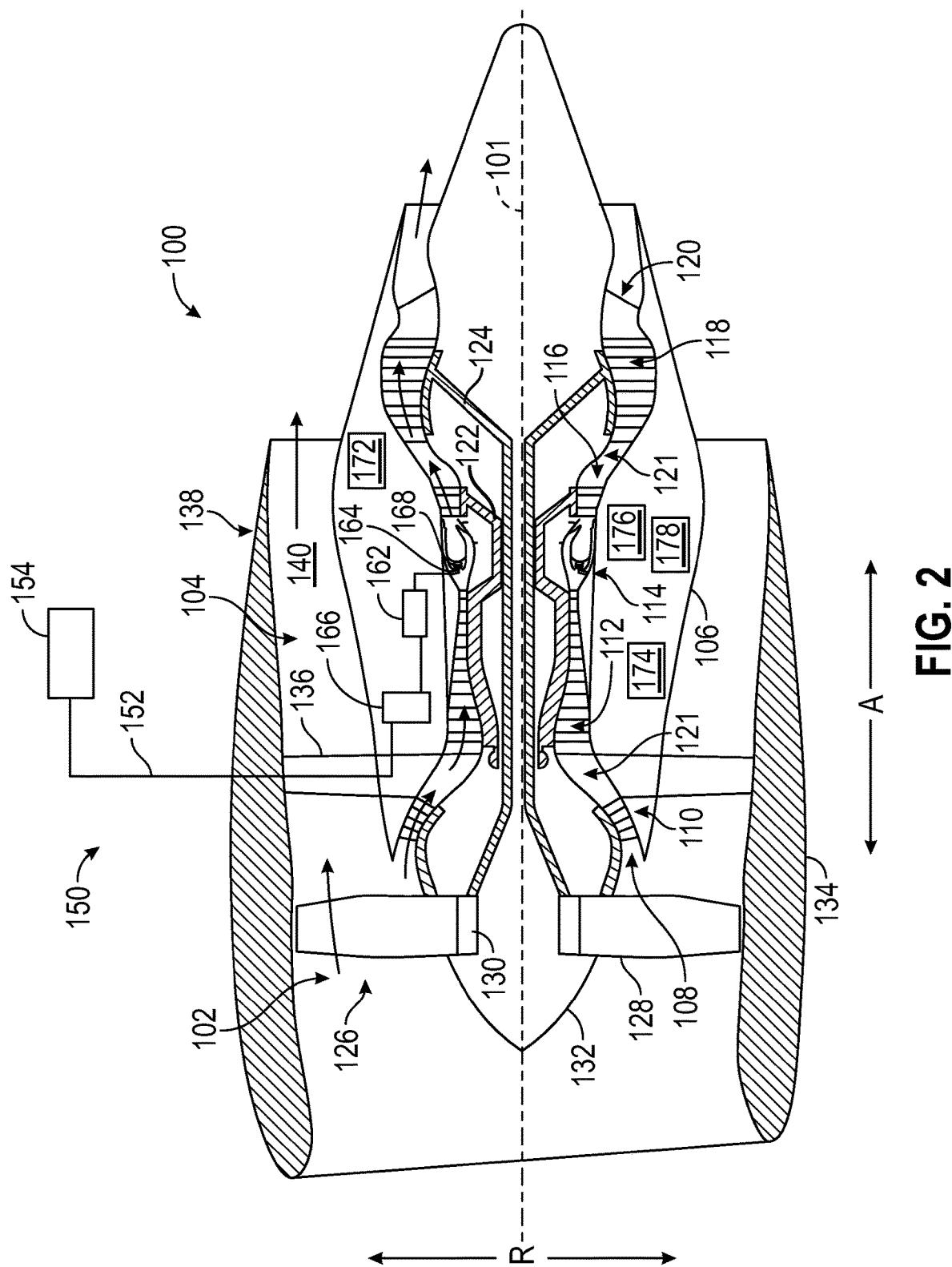
FIG. 2 is a schematic, cross-sectional view, taken along line 2-2 in FIG. 1, of a gas turbine engine for the aircraft shown in FIG. 1.

The turbomachine 104 depicted in FIG. 2 includes a tubular outer casing 106 that defines an annular inlet 108. The outer casing 106 encases, in a serial flow relationship, a compressor section including a booster or low-pressure (LP) compressor 110 and a high-pressure (HP) compressor 112, a combustion section (combustor) 114, a turbine section including a high-pressure (HP) turbine 116 and a low-pressure (LP) turbine 118, and a jet exhaust nozzle section 120. The compressor section, the combustion section 114, and the turbine section together define at least in part a core air flowpath 121 extending from the annular inlet 108 to the jet exhaust nozzle section 120. The turbofan engine further includes one or more drive shafts. More specifically, the turbofan engine includes a high-pressure (HP) shaft or spool 122 drivingly connecting the HP turbine 116 to the HP compressor 112, and a low-pressure (LP) shaft or spool 124 drivingly connecting the LP turbine 118 to the LP compressor 110.

The fan section 102 shown in FIG. 2 includes a fan 126 having a plurality of fan blades 128 coupled to a disk 130 in a spaced-apart manner. The fan blades 128 and the disk 130 are rotatable, together, about the longitudinal centerline (axis) 101 by the LP shaft 124. The disk 130 is covered by rotatable front hub 132 aerodynamically contoured to promote an airflow through the plurality of fan blades 128. Further, an annular fan casing or outer nacelle 134 is provided, circumferentially surrounding the fan 126 and/or at least a portion of the turbomachine 104. The nacelle 134 is supported relative to the turbomachine 104 by a plurality of circumferentially spaced outlet guide vanes 136. A downstream section 138 of the nacelle 134 extends over an outer portion of the turbomachine 104 so as to define a bypass airflow passage 140 therebetween.

The turbofan engine 100 is operable with the fuel system 150 and receives a flow of fuel from the fuel system 150. The fuel system 150 includes a fuel delivery assembly 152 providing the fuel flow from the fuel tank 154 to the engine 100, and more specifically to a fuel manifold 162. The fuel delivery assembly 152 includes tubes, pipes, and the like, to fluidly connect the various components of the fuel system 150 to the engine 100. The fuel system 150 may also include a fuel pump (not shown) in fluid connection with the fuel in the fuel delivery assembly 152. The fuel pump may be located downstream of the fuel tank 154 and upstream of the metering valve 166 (discussed below). The fuel pump is used to induce the flow of the fuel through the fuel delivery assembly 152 to the engine 100. The fuel pump may generally be the primary source of pressure rise in the fuel delivery assembly 152 between the fuel tank 154 and the engine 100.

The fuel system 150 also includes a fuel metering unit in fluid communication with the fuel delivery assembly 152. In this embodiment, the fuel metering unit is a metering valve 166 positioned downstream of the fuel pump, and upstream of the fuel manifold 162. The fuel system 150 is configured to provide the metering valve 166, and the metering valve 166 is configured to receive, fuel from the fuel tank 154. The metering valve 166 is further configured to provide the flow of fuel to the engine 100 in a desired manner. More specifically, as depicted schematically in FIG. 2, the metering valve 166 is configured to provide a desired volume of fuel, at, for example, a desired flow rate, to the fuel manifold 162 of the engine 100. The fuel manifold 162 then distributes (provides) the fuel received to a plurality of fuel nozzles 164 within the combustion section 114 of the engine 100 where the fuel is mixed with compressed air and the mixture of fuel and compressed air is combusted to generate combustion gases that drive the engine 100. Adjusting the metering valve 166 changes the volume of fuel provided to the combustion section 114 of the engine 100 and, thus, changes the amount of propulsive thrust produced by the engine 100 to propel the aircraft 10.

As discussed above, the compressor section, the combustion section (combustor) 114, and the turbine section form, at least in part, the core air flowpath 121 extending from the annular inlet 108 to the jet exhaust nozzle section 120. Air entering through the annular inlet 108 is compressed by blades of a plurality of fans of the LP compressor 110 and HP compressor 112. At least a portion of the compressed air enters (as primary air) the forward end of a combustion chamber of the combustor 114. Fuel is injected by the fuel nozzle 164 into compressed air and mixed with the compressed, primary air. The fuel nozzle 164 of this embodiment is part of a swirler/fuel nozzle assembly. The swirler/fuel nozzle assembly includes a swirler 168 that is used to generate turbulence in the primary air. The fuel nozzle 164 injects fuel into the turbulent airflow of the primary air and the turbulence promotes rapid mixing of the fuel with the primary air. The mixture of fuel and compressed air is combusted in the combustion chamber, generating combustion gases (combustion products), which accelerate as the combustion gases leave the combustion chamber. The products of combustion are accelerated as the products are expelled through the outlet of the combustion chamber to drive the engine 100. More specifically, the combusted fuel air mixture is accelerated through the outlet to turn the turbines (e.g., drive the turbine blades) of the HP turbine 116 and the LP turbine 118. As discussed above, the HP turbine 116 and the LP turbine 118, among other things, drive the LP compressor 110 and HP compressor 112.

The turbofan engine 100 also includes various accessory systems to aid in the operation of the turbofan engine 100 and/or an aircraft including the turbofan engine 100. For example, the turbofan engine 100 may include a main lubrication system 172, a compressor cooling air (CCA) system 174, an active thermal clearance control (ATCC) system 176, and generator lubrication system 178, each of which is depicted schematically in FIG. 2. The main lubrication system 172 is configured to provide a lubricant to, for example, various bearings and gear meshes in the compressor section, the turbine section, the HP spool 122, and the LP shaft 124. The lubricant provided by the main lubrication system 172 may increase the useful life of such components and may remove a certain amount of heat from such components. The compressor cooling air (CCA) system 174 provides air from one or both of the HP compressor 112 or LP compressor 110 to one or both of the HP turbine 116 or LP turbine 118. The active thermal clearance control (ATCC) system 176 cools a casing of the turbine section to maintain a clearance between the various turbine rotor blades and the turbine casing within a desired range throughout various engine operating conditions. The generator lubrication system 178 provides lubrication to an electronic generator (not shown), as well as cooling/heat removal for the electronic generator. The electronic generator may provide electrical power to, for example, a startup electrical motor for the turbofan engine 100 and/or various other electronic components of the turbofan engine 100 and/or an aircraft including the turbofan engine 100. The lubrication systems for the engine 100 (e.g., the main lubrication system 172 and the generator lubrication system 178) may use hydrocarbon fluids, such as oil, for lubrication, in which the oil circulates through inner surfaces of oil scavenge lines.

It will be appreciated, however, that the turbofan engine 100 discussed herein is provided by way of example only. In other embodiments, any other suitable engine may be utilized with aspects of the present disclosure. For example, in other embodiments, the engine may be any other suitable gas turbine engine, such as a turboshaft engine, a turboprop engine, a turbojet engine, and the like. In such a manner, it will further be appreciated that, in other embodiments, the gas turbine engine may have other suitable configurations, such as other suitable numbers or arrangements of shafts, compressors, turbines, fans, etc. Further, although the turbofan engine 100 is shown as a direct drive, fixed-pitch turbofan engine 100, in other embodiments, a gas turbine engine may be a geared gas turbine engine (i.e., including a gearbox between the fan 126 and shaft driving the fan, such as the LP shaft 124), may be a variable pitch gas turbine engine (i.e., including a fan 126 having a plurality of fan blades 128 rotatable about their respective pitch axes), etc. Further, still, in alternative embodiments, aspects of the present disclosure may be incorporated into, or otherwise utilized with, any other type of engine, such as reciprocating engines, as discussed above. Additionally, in still other exemplary embodiments, the exemplary turbofan engine 100 may include or be operably connected to any other suitable accessory systems. Additionally, or alternatively, the exemplary turbofan engine 100 may not include or be operably connected to one or more of the accessory systems 172, 174, 176, 178, discussed above.

As noted above, various different components of the engine 100 contact a hydrocarbon fluid (e.g., fuels and oils) at elevated temperatures. FIG. 3 is a schematic of a portion of a component 200 configured to be in contact with the hydrocarbon fluid. The component 200 may be, for example, the fuel nozzle 164, the swirler 168, an oil scavenge line of the main lubrication system 172 and the generator lubrication system 178, and/or any other component that is configured to be in contact with a hydrocarbon fluid, whether that component is in the engine 100 or another system. The component 200 includes a fluid passage 210 through which the hydrocarbon fluid is located and flows and a containment wall 220. The wall 220 may generally be constructed of any suitable material for the particular application. Typical materials used in the aircraft applications discussed above include stainless steel, corrosion-resistant alloys of nickel and chromium, and high-strength nickel-base alloys. The wall 220 may thus be formed from a metal alloy chosen from the group consisting of iron-based alloys, nickel-based alloys, and chromium-based alloys. The wall 220 also includes an interior surface 222. This interior surface 222 may form the boundary of the fluid passage 210 and thus may be a wetted surface or a contact surface that is wetted/contacted by the hydrocarbon fluid in the fluid passage 210. In some embodiments, the component 200 may include a coating system 230 formed on the interior surface 222 of the wall 220, as will be described further below. Alternatively, the component 200 may be used without the outer layer 232 and the barrier layer 234 coating system 230 and instead the coating (chelating layer 238) may be formed directly on the interior surface 222 of the wall 220.

The coating system 230 serves to prevent or reduce the formation and adhesion of the carbonaceous (coke) deposits that would otherwise form on an adhere to the interior surface 222 of the wall 220. The coating system 230 of this embodiment is a multi-layer coating including an outer layer 232 and a barrier layer 234 formed between the outer layer and the interior surface 222 of the wall 220. When the coating system 230 is applied to the wall 220 the outer layer 232 is the layer in contact with the hydrocarbon fluid in the fluid passage 210, and the outer layer 232 has a contact surface 236, which is the surface in contact with or wetted by the hydrocarbon fluid. The outer layer 232 of this embodiment is a metal M selected from the group consisting of nickel (Ni), palladium (Pd), and platinum (Pt). The contact layer may be a metal alloy comprising the metal M and may include nickel-based alloys, palladium-based alloys, and platinum-based alloys. Preferably, however, the outer layer 232 is the metal M, and even more preferably the outer layer 232 consists essentially of the metal M. In preferred embodiments, the metal M is platinum (Pt), and the outer layer 232 may consists essentially of platinum (Pt). The outer layer 232 may be as little as a monolayer (a single layer of atoms), but the outer layer 232 also may have a thickness of several Angstroms, with a preferred thickness of about 30 to about 100 nanometers. Greater thicknesses are also effective, though cost becomes a factor with increasing thickness. In a preferred embodiment, the outer layer 232 continuously covers the interior surface 222 of the wall 220 to provide the desired chemical and reflective properties throughout component 200 where elevated wall and/or fluid temperatures are likely. In some embodiments, the outer layer 232 may be used without the barrier layer 234, in which case, the substrate on which the outer layer 232 is formed is the wall 220. Preferably, the outer layer 232 is formed on the barrier layer 234, in which case, the substrate on which the outer layer 232 is formed is the barrier layer 234.

The barrier layer 234 prevents interdiffusion between the metal M, such as platinum (Pt), of the outer layer 232 and the wall 220, which could occur at an unacceptable rate at the temperatures of concern. In view of the thinness of the outer layer 232, the barrier layer 234 also protects the wall 220 from chemical attack from contaminants in the fluid, such as sulfur and water. The coating system 230 with the barrier layer 234 is preferred to prevent or inhibit reactions between constituents of the hydrocarbon fluid and the wall 220. The barrier layer 234 is preferably a ceramic barrier layer 234 and preferred materials for the barrier layer 234 are silica ($SiO_2$) and tantala ($Ta_2O_5$), and possibly mixtures of silica and tantala. Although any suitable material may be used, including for example, alumina ($Al_2O_3$), hafnia ($HfO_2$), and yttria ($Y_2O_3$). As previously noted, the thickness of the barrier layer 234 is preferably sufficient to prevent interdiffusion of the outer layer 232 with the wall 220. While optimal thicknesses will depend in part on the composition of the barrier layer 234, a minimum thickness is about 50 nanometers, with a more preferred range being about 300 to about 1000 nanometers, although greater thicknesses of up to about 5000 nm may also be used.

Each of the outer layer 232 and the barrier layer 234 may be formed by any suitable method, such as, for example, a chemical vapor deposition process that entails pumping an appropriate pre-cursor-containing vapor through the fluid passage 210. Each of the outer layer 232 and the barrier layer 234 may be deposited in one or more passes.

The use of the coating system 230 discussed above can considerably reduce the formation, deposition, and adhesion of carbonaceous (coke) deposits. Even further reductions in carbonaceous (coke) deposits are desired, however. We have surprisingly found that phosphorus can further reduce the deposition and adhesion of carbonaceous (coke) deposits. We were evaluating the addition of an organophosphorus compound used to stabilize fuel to see if the organophosphorus compound would poison the catalytic activity of the platinum coating. A coking evaluation was not an objective of this test, so we were surprised to observe almost complete spallation of the coke on coupons exposed to the fuel in which the organophosphorus compound was used. Moreover, when we evaluated the surface of these coupons, we surprisingly found clear evidence of a continuous presence of phosphorus on the surface of coupons having a platinum coating. The phosphorus was not present on other coupons without the coating.

The following test is demonstrative of the beneficial effect that phosphorus was found to have on carbonaceous (coke) deposits. In this test, coupons of a nickel-chromium alloy (Inconel® 625) were prepared and exposed to fuel (Jet A). The coupons were then subjected to repeated cycles that were designed to mimic the conditions in the fuel nozzle 164 during shut down of the engine 100. The coupons were heated (ramped) in an oven to 450° F. (232° C.) and held at that temperature for two hours. The system was then primed with cold fuel, after which the cycle was repeated for a total of 150 cycles in this test. In this test, some of the coupons were exposed to fuel containing an additive of phosphorus (additized fuel), and others were exposed to a fuel without the additive (neat fuel).

This test demonstrated that the addition of phosphorus had a marked improvement (reduction) in the amount of carbonaceous (coke) deposits. The coupons were evaluated using a scanning electron microscope (SEM). A SEM image was generated, and the coupons were evaluated using energy dispersive X-ray spectroscopy (EDS), generating element maps and EDS spectrums. FIGS. 4A-5F are black and white images drawn from these results. FIGS. 4A-4F are for a test coupon exposed to the neat fuel (herein "neat coupon"), and FIGS. 5A-5F are for a test coupon exposed to the additized fuel (herein "additized coupon"). FIGS. 4A and 5A are representative of the SEM image generated. FIGS. 4B-4E and 5B-5E are representative of the elemental maps, with each dot indicating the presence of the element mapped. FIGS. 4B and 5B are elemental maps of nitrogen (N). FIGS. 4C and 5C are elemental maps of phosphorus (P). FIGS. 4D and 5D are elemental maps of oxygen (O). FIGS. 4E and 5E are elemental maps of carbon (C). FIGS. 4F and 5F are EDS spectrums from the neat coupon and the additized coupon, respectively.

The coke deposits can be seen in the SEM images of FIGS. 4A and 5A. The amount of coke deposited on the additized coupon (FIG. 5A) is less than that amount of coke for the neat coupon (FIG. 4A). As noted above, FIG. 5A shows almost complete spallation of the coke. As can be seen by comparing FIGS. 4A and 5A with FIGS. 4E and 5E, respectively, the locations of carbon in FIGS. 4E and 5E correspond to the locations of the coke deposits in FIGS. 4A and 5A. As can be seen by comparing FIG. 5C with FIG. 5E, respectively, the regions of carbon in FIG. 5E on the additized coupon are absent or greatly reduced in the locations were phosphorus is present (FIG. 5C). As noted above and as can be seen in FIG. 5C, phosphorus was found in a near continuous distribution over the surface of the coupon. In contrast, phosphorus is nearly absent in the neat coupon (see FIG. 4C) and carbon is present over a large portion of the neat coupon (see FIG. 4E). A similar result can be observed from the EDS spectrum. Where phosphorus is nearly absent, a large spike in carbon is present (FIG. 4F), but where phosphorus is present, the carbon is reduced (FIG. 5F).

Adding phosphorus to the fuel thus has a beneficial impact in reducing the amount of carbonaceous (coke) deposits. There are, however, practical limitations on including additives in the fuel, particularly for commercial applications. We have thus developed an alternate method of including phosphorus on the contact surface of the wall 220 of the component 200, such as the interior surface 222 or, when the coating system 230 is used, the contact surface 236. As shown in FIG. 3, the contact surface 236 is treated with a ligand to form a chelating layer 238 (or coating) on the contact surface 236. The ligands used to form the chelating layer 238 may be a phosphorus ligand, preferably bidentate ligands, for example having Formula I below:

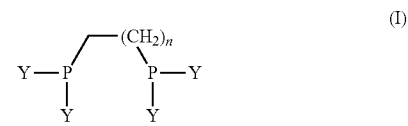

where n is an integer from 1-3; each Y is independently —R, —OR, —SR, or —NR'$_2$; each R may be the same or different and each is an alkyl group, preferably a linear, branched, or cyclic $C_1$-$C_6$ alkyl group, a benzyl group, a phenyl group, an alkyl phenyl group, or an aryl group, optionally containing one or more heteroatoms, e.g. furans, pyridines, pyrroles, pyrimidines, thiophenes; and each R' may be the same or different and each is either H or R. In some embodiments, the heteroatom is one or more of O, S or N. In exemplary embodiments, R is alkyl. In preferred embodiments, R (or R') is a bulky alkyl substituent, for example C5-C6 cycloalkyl, tert-butyl, tert-pentyl, tert-hexyl, iso-propyl, iso-butyl, iso-pentyl, iso-hexyl, sec-butyl, sec-pentyl, sec-hexyl, neo-pentyl, and neo-hexyl. Cyclohexyl is exemplary. A bulky substituent (R or R') is preferred, as a long-chain substituent (R or R') could react with the Pt atom and cyclize oxidatively to cause the Pt(0) to oxidize to Pt(II). In preferred embodiments, n is 1, Y is OR and each R is cyclohexyl. Bidentate ligands are preferred to form a stable organometallic complex on the contact surface 236.

In these chelating bidentate ligands, the two phosphorus atoms are linked by an alkylene group, preferable an ethylene group (i.e., two methylene groups). The substituent Y may be an alkyl group, aryl group, alkoxy group, alkyl sulfide group, or an amino group. The chelating bidentate ligands shown above are synthesized to be coordinated or bonded to a metal atom M, which is preferably the same metal as the outer layer 232. The resulting generalized structure of the metal-ligand complex forming the chelating layer 238 is shown in Formula II below:

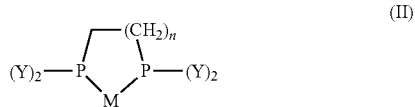

(II)

where Y and n are defined above; and the metal M is selected from the group consisting of nickel (Ni), palladium (Pd), and platinum (Pt). In an exemplary preferred embodiment, n is 1, Y is OR, and R is cyclohexyl.

Figure 6A:
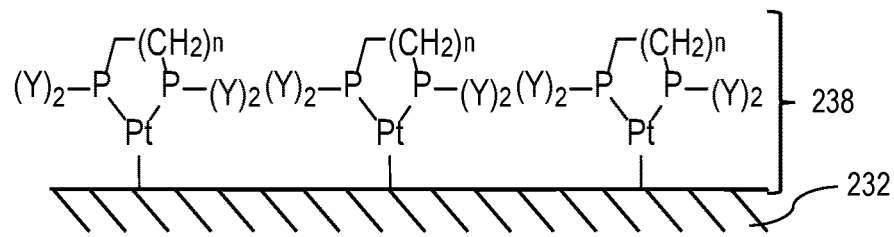
FIGS. 6A and 6B are cross-sectional views of the component shown in FIG. 3, showing detail 6 of FIG. 3.
Figure 6B:
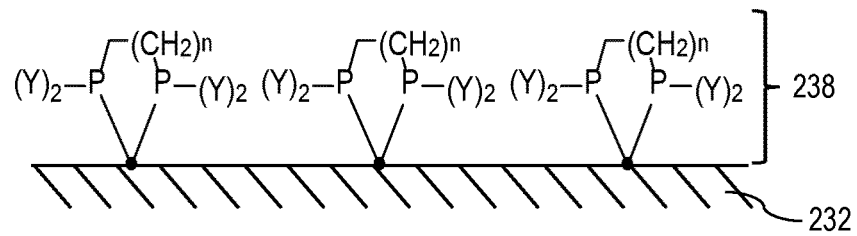

FIGS. 6A and 6B are detail views of detail 6 in FIG. 3. FIGS. 6A and 6B show the outer layer 232 and the chelating layer 238. In the embodiments shown in FIGS. 6A and 6B, the outer layer 232 is platinum (Pt), metal M is platinum (Pt). FIGS. 6A and 6B illustrate two different ways the phosphorous containing-ligand is attached to the contact surface 236 of the outer layer 232. In FIG. 6A, the two phosphorus (P) atoms are each coordinated or bonded to a platinum (Pt) atom, and the chelated platinum (Pt) atom is covalently bonded to at least one platinum (Pt) atom of the outer layer 232. Alternatively, as shown in FIG. 6B, the two phosphorus (P) atoms are each chelated with, coordinated to, or bonded to a platinum (Pt) atom of the outer layer 232.

Figure 7A:
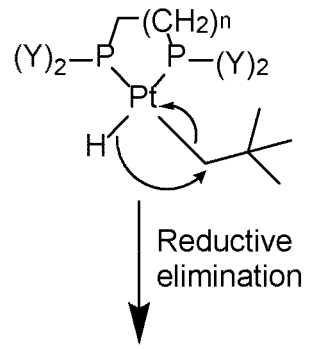
FIGS. 7A-7C illustrate the process for forming the chelating layer shown in FIGS. 6A and 6B.
Figure 7B:
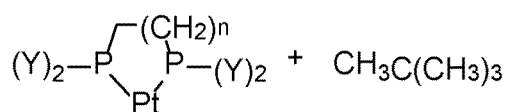
Figure 7C:
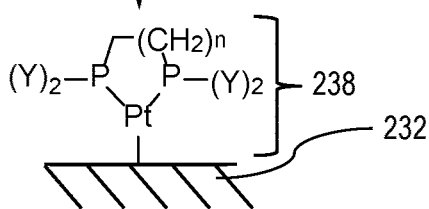

An advantage of the embodiments discussed herein is that the chelating layer 238 may be formed by a relatively simple process. After the outer layer 232 is formed, by chemical vapor deposition (as discussed above), for example, the outer layer 232 is treated by a solution containing a metal-ligand complex precursor. FIGS. 7A-7C illustrate a process in which the chelating layer 238 is formed. FIG. 7A shows the metal ligand in the solution according to a preferred embodiment. Herein the metal ligand in solution is a metal complex. More generally the metal-ligand complex precursor in the solution (metal complex) may have the following structure of Formula III:

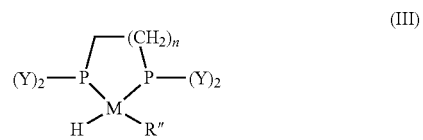

(III)

where n, Y, and M are as defined above, and R" is a substituent capable of being removed from the metal M by reductive elimination together with the H attached to M. Typically, R" is an alkyl group that lacks a beta-hydrogen in order to avoid beta hydride elimination. For example, in the embodiment shown in FIG. 7A, R" is a neopentyl group.

As noted above, the outer layer 232 is may be treated by a solution containing a metal-ligand complex precursor and a solvent. The metal-ligand complex precursor may comprise the metal M and phosphorus (P). The solvent may be any suitable organic solvent, include those in which the metal-ligand complex precursor, e.g. the neopentyl hydride, is soluble. Preferably, the solvent is an anhydrous solvent because water could cause some decomposition of the neopentyl hydride. In preferred embodiments, the solvent is a paraffin such as hexane, pentane, octane, etc., having the structure $C_xH_{2x+2}$, where x is an integer.

Treating the outer layer 232 includes causing the solution containing the metal-ligand complex precursor, such as the metal-ligand complex precursor shown in Formula III, to come into contact with the outer layer 232, such as by flowing the solution containing the metal-ligand complex precursor through the fluid passage 210 or by immersing the component 200 (or a portion thereof) in a bath of the solution. When the metal complex comes into contact with the platinum (Pt) of outer layer 232, the metal complex undergoes reductive elimination by thermal decomposition to generate neopentane and a five-membered platinacycle, as shown in FIG. 7B. The five-membered platinacycle then bonds to the platinum (Pt) of the outer layer 232 to form the chelating layer 238 as shown in FIG. 7C.

Alternatively, the outer layer 232 may be treated by a solution containing a metal-ligand complex precursor, in which the metal-complex precursor is a chelating ligand, as shown in Formula I, for example. Treating the outer layer in the same way as noted above, the ligand binds to the platinum of the outer layer 232 resulting in the structure shown in FIG. 6B.

Without limitation and being bound to any theory, the five-membered platinacycle is highly reactive and capable of attacking C—H and C—C bonds of a hydrocarbon fluid. The coordinatively unsaturated platinacycle is expected to deposit on the contact surface 236 of the platinum outer layer 232 and retain its high reactivity toward hydrocarbon bonds. As a result, incipient carbonaceous (coke) deposits are attacked by the platinacycle and can be easily swept away instead of depositing on the contact surface 236.

The embodiments described herein have been described relative to a gas turbine engine 100 used in an aircraft 10, but the embodiments discussed herein may also be applicable to other applications where hydrocarbon fuel is allowed to dwell at elevated temperatures. The engines described herein are gas turbine engines, but the embodiments described herein also may be applicable to other engines and other vehicles beyond the aircraft 10 explicitly described herein, such as boats, ships, cars, trucks, and the like.

Further aspects of the present disclosure are provided by the subject matter of the following clauses.

A method of preparing a contact surface of a component for contact with a hydrocarbon fluid, the method comprising: forming the contact surface from a metal, the metal comprising a metal M, wherein M is selected from the group consisting of nickel (Ni), palladium (Pd), and platinum (Pt); treating the contact surface with a metal-ligand complex precursor comprising a phosphorus (P) ligand.

The method of any preceding clause, wherein the phosphorus (P) ligand is a bidentate ligand.

The method of any preceding clause, wherein the metal-ligand complex precursor comprises the following structure:

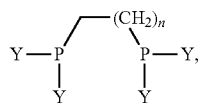

wherein n is and integer from 1-3; each Y is independently —R, —OR, —SR, or —NR'$_2$; each R may be the same or different and each is an alkyl group or aryl group, optionally substituted with one or more heteroatoms; and each R' may be the same or different and each is either H or R.

The method of any preceding clause, wherein R is one of a linear, branched, and cyclic $C_1$-$C_6$ alkyl group, a benzyl group, a phenyl group, an alkyl phenyl group, or an aryl group, optionally substituted with one or more of O, S, or N.

The method of any preceding clause, wherein the metal-ligand complex precursor has the following structure:

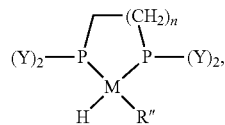

wherein n is an integer from 1-3; each Y is independently —R, —OR, —SR, and —NR'$_2$ with R being an alkyl group or aryl group optionally substituted with one or more heteroatoms; and R' being one of hydrogen (H) and R; R" is an alkyl group that lacks a beta-hydrogen; and M is selected from the group consisting of nickel (Ni), palladium (Pd), and platinum (Pt).

The method of any preceding clause, wherein R is one of a linear, branched, and cyclic $C_1$-$C_6$ alkyl group, a benzyl group, a phenyl group, an alkyl phenyl group, or an aryl group, optionally substituted with one or more of O, S, or N.

The method of any preceding clause, wherein R" is a neopentyl group.

The method of any preceding clause, wherein each Y is the same.

The method of any preceding clause, wherein treating the contact surface includes exposing the contact surface to a fluid containing the metal-ligand complex precursor.

The method of any preceding clause, wherein the fluid is a solution containing the metal-ligand complex precursor and a solvent.

The method of any preceding clause, wherein the solvent is an anhydrous solvent.

The method of any preceding clause, wherein the solvent is a paraffin.

The method of any preceding clause, wherein M is platinum (Pt).

The method of any preceding clause, wherein the contact surface consists essentially of platinum (Pt).

The method of any preceding clause, wherein the contact surface is a metal alloy comprising the metal M.

The method of any preceding clause, wherein forming the contact surface includes coating a substrate with the metal M by chemical vapor deposition.

The method of any preceding clause, further comprising forming a barrier layer on a substrate and forming the contact surface includes coating the barrier layer with the metal M.

The method of any preceding clause, wherein the barrier layer is a ceramic material chosen from the group consisting of silica and tantala.

The method of any preceding clause, wherein the substrate is a metal alloy chosen from the group consisting of iron-based alloys, nickel-based alloys, and chromium-based alloys.

A component configured to be in contact with a hydrocarbon fluid, the component comprising: a wall having a contact surface configured to be in contact with the hydrocarbon fluid, the contact surface being formed from a metal, the metal comprising a metal M, wherein M is selected from the group consisting of nickel (Ni), palladium (Pd), and platinum (Pt); and a metal-ligand complex on the contact surface, the metal-ligand complex comprising phosphorus (P).

The component of any preceding clause, wherein the metal of the metal-ligand complex comprises the metal M of the contact surface.

The component of any preceding clause, wherein the metal of the metal-ligand complex is covalently bound to the metal M of the contact surface.

The component of any preceding clause, wherein the metal-ligand complex comprises a bidentate ligand.

The component of any preceding clause, wherein the metal-ligand complex has the following structure:

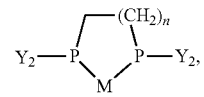

wherein n is an integer from 1-3; each Y is independently —R, —OR, —SR, and —NR'$_2$ with R being an alkyl group or aryl group optionally substituted with one or more heteroatoms; and R' being one of hydrogen (H) and R.

The component of any preceding clause, wherein R is one of a linear, branched, and cyclic $C_1$-$C_6$ alkyl group, a benzyl group, a phenyl group, an alkyl phenyl group or an aryl group, optionally substituted with one or more of O, S, or N.

The component of any preceding clause, wherein each Y is the same.

The component of any preceding clause, wherein M is platinum (Pt).

The component of any preceding clause, wherein the contact surface consists essentially of platinum (Pt).

The component of any preceding clause, wherein the contact surface is a metal alloy comprising the metal M.

The component of any preceding clause, wherein the contact surface is an outermost layer formed on a surface of the wall.

The component of any preceding clause, further comprising a ceramic barrier layer between the outermost layer and the wall.

The component of any preceding clause, wherein the ceramic barrier layer is a ceramic material chosen from the group consisting of silica and tantala.

The component of any preceding clause, wherein the wall is formed from a metal alloy chosen from the group consisting of iron-based alloys, nickel-based alloys, and chromium-based alloys.

The component of any preceding clause, further comprising a flow passage, the flow passage having an inner surface, the inner surface being the contact surface.

A gas turbine engine comprising at least one of a fuel nozzle, a swirler, and an oil scavenge line, at least one of the fuel nozzle, the swirler, and the oil scavenge line being the component of any preceding clause, wherein, when the component is the fuel nozzle, the contact surface is an interior surface of the fuel nozzle, wherein, when the component is the swirler, the contact surface is an interior surface of the swirler, and wherein, when the component is the oil scavenge line, the contact surface is an interior surface of the oil scavenge line.

An aircraft comprising the gas turbine engine of any preceding clause.

The aircraft of any preceding clause, further comprising a fuselage, a wing connected to the fuselage, and a pylon connecting the gas turbine engine to the wing.

Although the foregoing description is directed to the preferred embodiments, it is noted that other variations and modifications will be apparent to those skilled in the art, and may be made without departing from the spirit or scope of the disclosure Moreover, features described in connection with one embodiment may be used in conjunction with other embodiments, even if not explicitly stated above.

What we claim is:

1. A gas turbine engine comprising a component configured to be in contact with a hydrocarbon fluid, the component comprising:
   a wall having a contact surface configured to be in contact with the hydrocarbon fluid, the contact surface being formed from a metal, the metal comprising a metal M, wherein M is selected from the group consisting of nickel (Ni), palladium (Pd), and platinum (Pt); and
   a metal-ligand complex on the contact surface, the metal-ligand complex comprising phosphorus (P),
   wherein the component is at least one of a fuel nozzle, a swirler, or an oil scavenge line.

2. The gas turbine engine of claim 1, wherein the metal of the metal-ligand complex comprises the metal M of the contact surface.

3. The gas turbine engine of claim 1, wherein the metal of the metal-ligand complex is covalently bound to the metal M of the contact surface.

4. The gas turbine engine of claim 1, wherein the metal-ligand complex comprises a bidentate ligand.

5. The gas turbine engine of claim 1, wherein the contact surface is a metal alloy comprising the metal M.

6. The gas turbine engine of claim 1, wherein the wall is formed from a metal alloy chosen from the group consisting of iron-based alloys, nickel-based alloys, and chromium-based alloys.

7. The gas turbine engine of claim 1, further comprising a flow passage, the flow passage having an inner surface, the inner surface being the contact surface.

8. The gas turbine engine of claim 1, wherein the component is the fuel nozzle and the contact surface is an interior surface of the fuel nozzle.

9. The gas turbine engine of claim 1, wherein the component is the swirler and the contact surface is an interior surface of the swirler.

10. The gas turbine engine of claim 1, wherein the component is the oil scavenge line and the contact surface is an interior surface of the oil scavenge line.

11. The gas turbine engine of claim 1, wherein M is platinum (Pt).

12. The gas turbine engine of claim 1, wherein the contact surface consists essentially of platinum (Pt).

13. The gas turbine engine of claim 1, wherein the contact surface is an outermost layer formed on a surface of the wall.

14. The gas turbine engine of claim 13, wherein the outermost layer is a continuous layer formed on the surface of the wall.

15. The gas turbine engine of claim 13, wherein the outermost layer has a thickness from 30 nanometers to 100 nanometers.

16. A component configured to be in contact with a hydrocarbon fluid, the component comprising:
   a wall having a contact surface configured to be in contact with the hydrocarbon fluid, the contact surface being an outermost layer formed on a surface of the wall and being formed from a metal, the metal comprising a metal M, wherein M is selected from the group consisting of nickel (Ni), palladium (Pd), and platinum (Pt); and
   a metal-ligand complex on the contact surface, the metal-ligand complex has having the following structure:

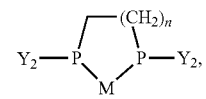

wherein n is an integer from 1-3; each Y is independently —R, —OR, —SR, and —NR'$_2$ with R being an alkyl group or aryl group optionally substituted with one or more heteroatoms; and R' being one of hydrogen (H) and R.

17. The component of claim 16, wherein R is one of a linear, branched, and cyclic $C_1$-$C_6$ alkyl group, a benzyl group, a phenyl group, an alkyl phenyl group or an aryl group, optionally substituted with one or more of O, S, or N.

18. The component of claim 16, wherein each Y is the same.

19. A component configured to be in contact with a hydrocarbon fluid, the component comprising:
   a wall having a contact surface configured to be in contact with the hydrocarbon fluid, the contact surface being an outermost layer formed on a surface of the wall and being formed from a metal, the metal comprising a metal M, wherein M is selected from the group consisting of nickel (Ni), palladium (Pd), and platinum (Pt);
   a metal-ligand complex on the contact surface, the metal-ligand complex comprising phosphorus (P); and
   a ceramic barrier layer between the outermost layer and the wall.

20. The component of claim 19, wherein the ceramic barrier layer is a ceramic material chosen from the group consisting of silica and tantala.

* * * * *